United States Patent
Ji et al.

(10) Patent No.: US 7,933,576 B2
(45) Date of Patent: Apr. 26, 2011

(54) SUB-HARMONIC MIXER

(75) Inventors: Hong Gu Ji, Daejeon (KR); Hae Cheon Kim, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 612 days.

(21) Appl. No.: 11/946,315

(22) Filed: Nov. 28, 2007

(65) Prior Publication Data
US 2008/0132194 A1    Jun. 5, 2008

(30) Foreign Application Priority Data

Dec. 5, 2006 (KR) .......... 10-2006-0122529
Aug. 28, 2007 (KR) .......... 10-2007-0086662

(51) Int. Cl.
*H04B 1/16* (2006.01)
(52) U.S. Cl. ................ 455/323; 455/326
(58) Field of Classification Search .......... 455/313, 455/318, 319, 323, 324, 326, 333, 334
See application file for complete search history.

(56) References Cited

U.S. PATENT DOCUMENTS

| | | | | |
|---|---|---|---|---|
| 3,491,301 A * | 1/1970 | Thompson | ..... | 455/319 |
| 5,826,183 A * | 10/1998 | Apel | ..... | 455/326 |
| 6,317,590 B1 | 11/2001 | Nash et al. | | |
| 7,120,414 B2 * | 10/2006 | Kim et al. | ..... | 455/313 |
| 7,369,837 B2 * | 5/2008 | Kim | ..... | 455/322 |
| 7,570,936 B2 * | 8/2009 | Vice | ..... | 455/326 |
| 7,672,658 B2 * | 3/2010 | Chang et al. | ..... | 455/318 |
| 7,738,844 B2 * | 6/2010 | Nakano et al. | ..... | 455/118 |
| 7,792,215 B2 * | 9/2010 | Choi et al. | ..... | 375/316 |
| 2004/0106391 A1 * | 6/2004 | Romano | ..... | 455/323 |
| 2004/0214547 A1 * | 10/2004 | Kim et al. | ..... | 455/296 |
| 2006/0199561 A1 * | 9/2006 | Ji | ..... | 455/293 |
| 2008/0009259 A1 * | 1/2008 | Chang et al. | ..... | 455/318 |

FOREIGN PATENT DOCUMENTS

| | | |
|---|---|---|
| JP | 2004-159342 | 6/2004 |
| KR | 1019990040208 A | 6/1999 |
| KR | 1020010069649 A | 7/2001 |
| KR | 1020050024683 | 3/2005 |
| WO | WO2004/032339 | 4/2004 |

OTHER PUBLICATIONS

B. Razavi; "RF Microelectronics", Prentice Hall, 1998, 16 pages.
Thomas Lee; "The Design of CMOS Radio-Frequency Integrated Circuits" Cambridge University Press, 1998, 12 pages.

* cited by examiner

*Primary Examiner* — Blane J Jackson
(74) *Attorney, Agent, or Firm* — Ladas & Parry LLP

(57) ABSTRACT

A sub-harmonic mixer is provided, which includes: a mixer core having first and second transistors performing switching operations in response to a local oscillator (LO) signal and a radio frequency (RF) signal; a power source applying bias maximizing nonlinearity of a transistor included in the mixer core; an RF port applying an RF signal to the mixer core; an LO port applying an LO signal to the mixer core; and first and second phase delay circuits in which the RF signals applied to the first and second transistors have a 180-degree phase difference.

20 Claims, 1 Drawing Sheet

SUB-HARMONIC MIXER

CROSS-REFERENCE TO RELATED APPLICATION

This application claims priority to and the benefit of Korean Patent Application Nos. 2006-122529, filed Dec. 5, 2006, and 2007-86662, filed Aug. 28, 2007, the disclosures of which are incorporated herein by reference in their entirety.

BACKGROUND

1. Field of the Invention

The present invention relates to a sub-harmonic mixer, and more particularly, to a direct-conversion sub-harmonic mixer which is embodied to improve isolation characteristics of an RF signal and a double local oscillator (2LO) signal.

The present research was performed as a part of the IT New Growth Engine Business Planning by the Ministry of Information and Communication (South Korea) and the Institute for Information Technology Advancement (South Korea) [2005-S-039-02, SoP for 60 GHz Pico Cell communication].

2. Discussion of Related Art

Generally, in a wireless communication system using an electric wave, a frequency converter coverts a radio frequency (RF) signal having very low power which is input through an antenna and a local oscillator (LO) signal output from a local oscillator in the system into a baseband frequency signal corresponding to a frequency difference between the two signals. Such frequency conversion may be simply performed by a nonlinear circuit multiplying two signals, and thus the frequency converter generally includes a core functioning as an analog multiplier, input/output buffers, a filter, and so on.

A general theory and conventional technology of a frequency converter circuit are disclosed in "RF Microelectronics" (Prentice Hall, 1998) by B. Razavi, and "The Design of CMOS Radio-Frequency Integrated Circuits" (Cambridge University Press, 1998) by Thomas Lee.

A 0-IF system has been popular in recent times, wherein "0-IF" means a direct conversion method without using an intermediate frequency (IF), that is, the IF is 0 Hz. This method is opposite to a super heterodyne method which is currently widely used.

That is, this is a method of instantly pulling up/down a carrier to a baseband without using an IF. To be exact, although a conventional communication method has to employ this 0-IF method, it chooses a method without using the IF because of several problems including channel selectivity. That is, the 0-IF method has many problems that have to be overcome.

However, the method using 0-IF has significant advantages of low production cost, light weight and system unification since a surface acoustic wave filter (SAW filter) is not needed.

Thus, efforts to use 0-IF in mobile communication, for example, a global system for mobile communication (GSM), are being made, and therefore a number of mobile communication systems employing the 0-IF method has recently increased.

Particularly, a direct conversion receiver (DCR) adopting the 0-IF method or the direct conversion method is easily formed in one integrated circuit due to a simple circuit configuration, as compared to the super heterodyne receiver, and thus may be manufactured in a small size and at a low cost.

However, the DCR has some disadvantages. One problem that the DCR has is a second intermodulation distortion (IMD2) provided in the mixer. The IMD2 is caused by the fact that a mixer generally uses a nonlinear active device.

That is, the mixer may generate nonlinear distortion, which may be harmonic distortion generated in integer times of an input frequency, or the IMD2 in which different components are multiplied in order to form a new component.

In general, an LO signal is efficiently operated as a square wave by a switching operation of the mixer. Such a switching operation provides many advantages including low noise, high gain, sensing device's mismatching and deformation, sensing an exact LO length, and simple design.

However, such a switching operation has a disadvantage of producing odd-order mixing products (OMPs). Here, the OMP is generally defined by a product obtained by multiplying two different input odd-numbered harmonics.

This may be overcome by employing a sub-harmonic mixer to the DCR, wherein the mixer may overcome this problem by isolating the RF signal and the LO signal due to a limited separation state in-between paths thereof.

For example, in the conventional sub-harmonic mixer, the RF signal and the LO signal are input to a combiner, and the LO harmonic and the RF generated in the active device are mixed to thereby be directly input to an analog to digital converter (ADC). However, in this case, since the double LO (2LO) signal and the RF signal have frequency components, which are closely adjacent to each other, particularly in a millimeter wave band, isolation between the 2LO and the RF is difficult to ensure.

As an example of the conventional sub-harmonic mixer using a Gilbert cell mixer, the isolation characteristic between the 2LO and the RF may be improved, which results in poor manufacturing yield of a semiconductor integrated circuit due to a large number of transistors, high power consumption and complicated circuit configuration.

Also, in Korean Patent Publication No. 10-2005-0055733, as an example of the conventional sub-harmonic mixer, an IF signal formed in a mixer 1 is mixed with an LO signal phase-delayed by +90 and −90 degrees in a mixer 2 using a 45-degree phase shift circuit in a rear end of the LO signal and a front end of the mixer, thereby forming a baseband signal. This also has disadvantages of high power consumption and poor yield due to a number of the transistors.

SUMMARY OF THE INVENTION

The present invention is directed to a sub-harmonic mixer that can improve isolation between a double local oscillator (2LO) signal and an RF signal, which have closely adjacent frequency components, by including a phase delay circuit designed to input the RF signal to a mixer core to have a 180-degree phase difference, and to have a 180-degree phase difference with respect to the second harmonic signal 2LO.

One aspect of the present invention provides a sub-harmonic mixer, which includes: a mixer core having first and second transistors performing switching operations in response to a local oscillator (LO) signal and a radio frequency (RF) signal; a power source applying bias maximizing nonlinearity of a transistor included in the mixer core; an RF port applying an RF signal to the mixer core; an LO port applying an LO signal to the mixer core; and first and second phase delay circuits in which the RF signals applied to the first and second transistors have a 180-degree phase difference.

Here, the transistor included in the mixer core may be embodied as a bipolar junction transistor (BJT), or a complimentary MOS (CMOS) transistor.

Further, the first transistor Q1 of the mixer core may apply the RF signal provided from the RF port RF+ and the LO signal phase-delayed by 90 degrees by the first phase delay circuit LO+ to a base electrode, and a power voltage (VCC) to a first electrode, and a ground voltage (GND) to a second electrode.

Further, the second transistor Q2 of the mixer core may apply the RF signal phase-delayed by 180 degrees by the first and second phase delay circuits RF− and the LO signal phase-delayed by 90 degrees by the second phase delay circuit LO+ to a base electrode, a power voltage (VCC) to a first electrode, and a ground voltage (GND) to a second electrode.

Further, a power voltage (VCC) having a bias value maximizing nonlinearity of the first and second transistors Q1 and Q2 included in the mixer core may be applied, thereby generating second harmonic components (2LO signals) of the LO signal in the first and second transistors Q1 and Q2, respectively.

Also, an INPHASE baseband signal formed by downwardly-converting the mixture of the 2LO signal and the RF signal may be output with a 180-degree phase difference through output terminals I(+) and I(−) connected with the first electrode of the first and second transistors Q1 and Q2.

Also, the 2LO signal generated from the second transistor Q2 may be compensated with a 2LO signal 2LO+ generated from the first transistor Q1 by providing a 2LO signal 2LO− having a 180-degree phase difference to the base electrode of the first transistor Q1 through the first and second phase delay circuits.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

Figure 1:
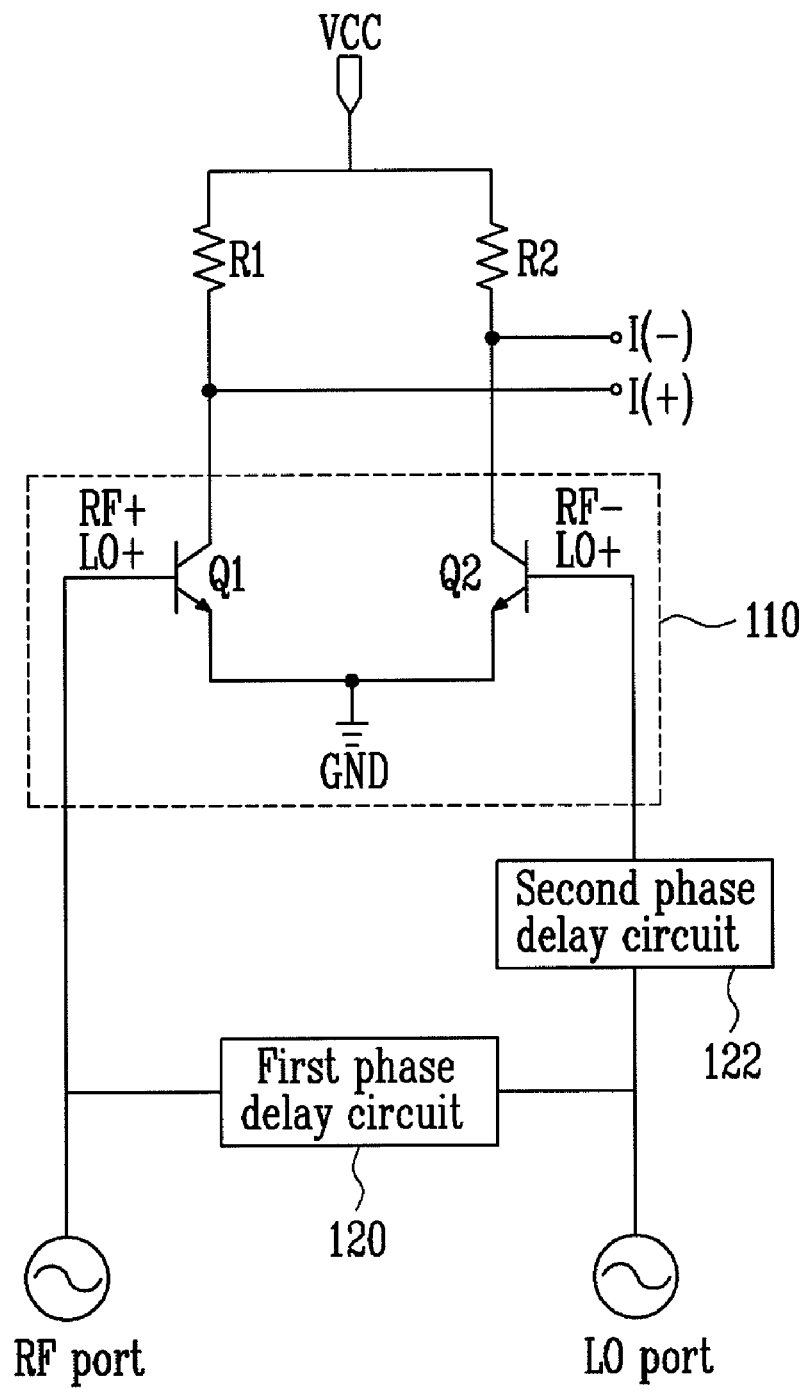
FIG. 1 is a circuit diagram of a sub-harmonic mixer according to an exemplary embodiment of the present invention.

The foregoing and other objects, features and advantages of the invention will be apparent from the following more particular description of exemplary embodiments of the invention, as illustrated in the accompanying drawings.

FIG. 1 is a circuit diagram of a sub-harmonic mixer according to an exemplary embodiment of the present invention.

Referring to FIG. 1, a sub-harmonic mixer according to an embodiment according to the present invention includes: a mixer core 110 having first and second transistors Q1 and Q2 performing a switching operation in response to a local oscillator (LO) signal and a radio frequency (RF) signal; a power source VCC applying bias maximizing nonlinearity of the transistor included in the mixer core 110; an RF port applying an RF signal to the mixer core 110; an LO port applying an LO signal to the mixer core 110; and first and second phase delay circuits 120 and 122 allowing an RF signal applied to the first and second transistors to have a 180-degree phase difference.

While FIG. 1 illustrates an exemplary embodiment in which a transistor included in the mixer core 110 is embodied as a bipolar junction transistor (BJT), the present invention is not limited thereto.

That is, the transistor may be a complimentary MOS (CMOS) transistor.

On the assumption that the transistor is embodied as the bipolar junction transistor (BJT), a circuit configuration of a sub-harmonic mixer according to the present invention will be described in detail.

In the first transistor Q1 of the mixer core 110, an RF signal RF+provided from an RF port and an LO signal LO+phase-delayed by 90 degrees by the first phase delay circuit 120 are applied to a base electrode, a power voltage VCC is applied to a first electrode, and a second electrode is grounded (GND).

Also, in the second transistor Q2 of the mixer core, an RF signal RF− phase-delayed by 180 degrees by the first and second phase delay circuits 120 and 122 and an LO signal LO+ phase-delayed by 90 degrees by the second phase delay circuit 122 are applied to a base electrode, a power voltage VCC is applied to a first electrode, and a second electrode is grounded (GND).

That is, the RF signals RF+ and RF−, which are respectively applied to the first and second transistors Q1 and Q2 from the RF port by the first and second phase delay circuits 120 and 122 have a 180-degree phase difference.

Alternatively, the LO signal applied through the LO port is phase-delayed by 90 degrees (LO+) by the first phase delay circuit 120 and then applied to the first transistor Q1, and phase-delayed by 90 degrees (LO+) by the second phase delay circuit 122 and applied to the second transistor Q2. That is, the LO signal from the LO port becomes the LO+ signal having the same phase when applied to the first and second transistors.

Here, since the LO signal has the same frequency as a carrier of the RF signal, the LO signal is directly converted down to a baseband signal without a transition to an intermediate frequency (IF).

An INPHASE baseband signal which is converted downward is output with a 180-degree phase difference through output terminals I(+) and I(−) connected with the first electrodes of the first and second transistors Q1 and Q2.

The mixer according to the present invention is characterized as a sub-harmonic mixer converting a second harmonic signal (2LO) of the LO signal generated from the mixer core 110 and the RF signal into a baseband frequency signal corresponding to a frequency difference therebetween.

Here, the second harmonic components of the LO signal, that is, the 2LO signals, are generated at the first and second transistors, respectively, by applying the power voltage VCC having a bias value which maximizes the nonlinearity of the first and second transistors Q1 and Q2 included in the mixer core. The 2LO signals and RF signal are mixed, and thus the downward-converted INPHASE baseband signals are output with a 180-degree phase difference through the output terminals I(+) and I(−) connected with the first electrodes of the first and second transistors Q1 and Q2.

Here, the power voltage corresponding to the bias value maximizing the nonlinearity of the first and second transistors may be a pinch-off voltage of a transistor.

For example, when the frequency of the RF signal is 61 GHz and the frequency of the LO signal is 30 GHz, the sub-harmonic mixer of the present invention outputs a signal having a baseband frequency of 1 GHz, i.e., a frequency difference between the RF signal and the 2LO signal by mixing the RF signal and the 2LO signal.

Also, according to the embodiment of the present invention, the 2LO signal generated from the second transistor Q2 passes through the first and second phase delay circuits 120 and 122, and thus the 2LO signal 2LO-having a 180-degree phase difference is provided to a base electrode node of the first transistor Q1 and the signal is compensated with the 2LO signal 2LO+generated from the first transistor Q1, thereby maximizing the isolation characteristic between the 2LO signal and the RF signal at the RF port terminal.

That is, the embodiment of the present invention includes a phase delay circuit designed to have a 180-degree phase difference, thereby compensating harmonic components generated from the first and second transistors Q1 and Q2, respectively, and thus improving the isolation characteristic between a double local oscillator signal (2LO signal) and the RF signal, which are closely adjacent to each other.

According to the present invention, circuits having a 180-degree phase difference, which are relatively easy to embody, may be inserted into an LO terminal and an RF terminal, thereby revolutionarily embodying a separation degree between a 2LO signal and an RF signal at the RF input terminal, and improving yield in manufacturing a semiconductor integration circuit due to easy configuration of the circuit.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A sub-harmonic mixer, comprising:
   a mixer core comprising first and second transistors performing switching operations in response to a local oscillator (LO) signal and a radio frequency (RF) signal;
   a power source applying bias maximizing nonlinearity of the first and second transistors included in the mixer core;
   an RF port applying an RF signal to the mixer core;
   an LO port applying an LO signal to the mixer core; and
   first and second phase delay circuits in which the RF signals applied to the first and second transistors have a 180-degree phase difference,
   wherein the RF signal provided from the RF port and the LO signal phase-delayed by 90 degrees provided by the first phase delay circuit are applied at a middle electrode node of the first transistor, a power voltage is applied to a first electrode node of the first transistor, and a ground voltage is applied a second electrode node of the first transistor.

2. The mixer according to claim 1, wherein the first transistor included in the mixer core is embodied as a bipolar junction transistor (BJT).

3. The mixer according to claim 2, wherein the middle electrode node of the first transistor is a base node, the first electrode of the first transistor is a collector node, and the second electrode of the first transistor is an emitter node.

4. The mixer according to claim 1, wherein the first transistor included in the mixer core is embodied as a CMOS transistor.

5. The mixer according to claim 1, wherein the RF signal phase-delayed by 180 degrees by the first and second phase delay circuits and the LO signal phase-delayed by 90 degrees by the second phase delay circuit are applied to a middle electrode node of the second transistor, the power voltage is applied to a first electrode node of the second transistor, and the ground voltage is applied to a second electrode node of the second transistor.

6. The mixer according to claim 1, wherein second harmonic components (2LO signals) of the LO signal are generated from the first and second transistors by applying a power voltage having a bias value maximizing the nonlinearity of the first and second transistors included in the mixer core.

7. The mixer according to claim 6, wherein the 2LO signals and the RF signal are mixed, and downward-converted INPHASE baseband signals are output with a 180-degree phase difference through output terminals connected with the first electrodes of the first and second transistors.

8. The mixer according to claim 6, wherein the 2LO signal generated from the second transistor is compensated with the 2LO signal generated from the first transistor by providing a 2LO signal having a 180-degree phase difference to a base electrode node of the first transistor through the first and second phase delay circuits.

9. The mixer according to claim 1, wherein the middle electrode node of the first transistor is a gate node, the first electrode node of the first transistor is a drain node, and the second electrode node of the first transistor is a source node.

10. The mixer according to claim 1 wherein the middle electrode node of the first transistor is a gate node, the first electrode of the first transistor is a source node, and the second electrode of the first transistor is a drain node.

11. The mixer according to claim 1, wherein the first and second transistors are npn BJTs.

12. The mixer according to claim 1, wherein the first and second transistors are pnp BJTs,.

13. A sub-harmonic mixer, comprising:
    a mixer core having first and second transistors performing switching operations in response to a local oscillator (LO) signal and a radio frequency (RF) signal;
    a power source applying bias maximizing nonlinearity of the first and second transistors included in the mixer core;
    an RF port applying an RF signal to the mixer core;
    an LO port applying an LO signal to the mixer core; and
    first and second phase delay circuits in which the RF signals applied to the first and second transistors have a 180-degree phase difference,
    wherein the RF signal phase-delayed by 180 degrees by the first and second phase delay circuits and the LO signal phase-delayed by 90 degrees by the second phase delay circuit are applied to a middle electrode node of the second transistor, a power voltage is applied to a first electrode node of the second transistor, and a ground voltage is applied to a second electrode node of the second transistor.

14. The mixer according to claim 13, wherein the RF signal provided from the RF port and the LO signal phase-delayed by 90 degrees provided by the first phase delay circuit are applied at a middle electrode node of the first transistor, the power voltage is applied to a first electrode node of the first transistor, and the ground voltage is applied a second electrode node of the first transistor.

15. The mixer according to claim 13, wherein second harmonic components (2LO signals) of the LO signal are generated from the first and second transistors by applying the power voltage having a bias value maximizing the nonlinearity of the first and second transistors included in the mixer core such that the 2LO signal generated from the second transistor is compensated with the 2LO signal generated from the first transistor by providing a 2LO signal having a 180-degree phase difference to the middle electrode node of the first transistor through the first and second phase delay circuits.

16. The mixer according to claim 13, wherein the first and second transistors are selected from the group consisting of an npn BJTs, a pnp BJTs, an n-CMOS transistor and a p-CMOS transistor.

17. The mixer according to claim 16, wherein the first and second transistors are selected from the group consisting of an npn BJTs, a pnp BJTs, a an n-CMOS transistor and a p-CMOS transistor.

18. A sub-harmonic mixer, comprising:
a mixer core having first and second transistors performing switching operations in response to a local oscillator (LO) signal and a radio frequency (RF) signal;
a power source applying bias maximizing nonlinearity of the first and second transistors included in the mixer core;
an RF port applying an RF signal to the mixer core;
an LO port applying an LO signal to the mixer core; and
first and second phase delay circuits in which the RF signals applied to the first and second transistors have a 180-degree phase difference,
wherein second harmonic components (2LO signals) of the LO signal are generated from the first and second transistors by applying a power voltage having a bias value maximizing the nonlinearity of the first and second transistors included in the mixer core such that the 2LO signal generated from the second transistor is compensated with the 2LO signal generated from the first transistor by providing a 2LO signal having a 180-degree phase difference to a middle electrode node of the first transistor through the first and second phase delay circuits.

19. The mixer according to claim 18, wherein the RF signal provided from the RF port and the LO signal phase-delayed by 90 degrees provided by the first phase delay circuit are applied at the middle electrode node of the first transistor, the power voltage is applied to a first electrode node of the first transistor, and the ground voltage is applied a second electrode node of the first transistor.

20. The mixer according to claim 18, wherein the RF signal phase-delayed by 180 degrees by the first and second phase delay circuits and the LO signal phase-delayed by 90 degrees by the second phase delay circuit are applied to a middle electrode node of the second transistor, the power voltage is applied to a first electrode node of the second transistor, and the ground voltage is applied to a second electrode node of the second transistor.

* * * * *